United States Patent
Lim et al.

(10) Patent No.: US 9,562,679 B2
(45) Date of Patent: Feb. 7, 2017

(54) LIGHTING DEVICE

(71) Applicant: LG Innotek Co., Ltd., Seoul (KR)

(72) Inventors: Dong Nyung Lim, Seoul (KR); Do Hwan Kim, Seoul (KR); Sang Hoon Lee, Seoul (KR); Keun Tak Joo, Seoul (KR); Tae Young Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 110 days.

(21) Appl. No.: 14/211,046

(22) Filed: Mar. 14, 2014

(65) Prior Publication Data

US 2014/0301080 A1 Oct. 9, 2014

(30) Foreign Application Priority Data

Apr. 4, 2013 (KR) .................. 10-2013-0036699
Apr. 4, 2013 (KR) .................. 10-2013-0036700

(51) Int. Cl.
| | |
|---|---|
| *F21S 4/00* | (2016.01) |
| *F21V 21/00* | (2006.01) |
| *F21V 29/00* | (2015.01) |
| *H05K 3/36* | (2006.01) |
| *F21V 29/77* | (2015.01) |

(Continued)

(52) U.S. Cl.
CPC ............ *F21V 29/22* (2013.01); *F21K 9/23* (2016.08); *F21V 23/006* (2013.01); *F21V 29/004* (2013.01); *F21V 29/773* (2015.01); *H05K 3/366* (2013.01); *F21Y 2101/00* (2013.01); *H05K 2201/048* (2013.01); *H05K 2201/10106* (2013.01)

(58) Field of Classification Search
CPC .................. F21K 9/135; F21K 9/1355; F21V 23/004–23/009; H05K 3/366
See application file for complete search history.

(56) References Cited

U.S. PATENT DOCUMENTS

| | | | |
|---|---|---|---|
| 2009/0175041 A1* | 7/2009 | Yuen | ................ F21K 9/135 362/294 |
| 2010/0141144 A1 | 6/2010 | Hofmann et al. | |
| 2011/0028015 A1 | 2/2011 | Mostoller et al. | |

(Continued)

FOREIGN PATENT DOCUMENTS

| | | |
|---|---|---|
| CN | 202032335 U | 11/2011 |
| DE | 102008035420 A1 | 2/2010 |

(Continued)

*Primary Examiner* — Peggy Neils
*Assistant Examiner* — Alexander Garlen
(74) *Attorney, Agent, or Firm* — Birch, Stewart, Kolasch & Birch, LLP

(57) ABSTRACT

A lighting device may be provided that includes: a heat sink; a light source module which is disposed on the heat sink, includes a substrate having at least one hole, and includes a plurality of light emitting devices disposed on a top surface of the substrate; a power supply unit which is disposed within the heat sink and includes a support plate and a plurality of parts disposed on the support plate; and a soldering portion which connects the substrate and the support plate. The support plate includes an extended substrate which is disposed in the hole of the substrate. The extended substrate includes a through-portion which has passed through the hole of the substrate. The soldering portion electrically connects the through-portion of the extended substrate and the top surface of the substrate.

19 Claims, 14 Drawing Sheets

(51) Int. Cl.
*F21V 23/00* (2015.01)
*F21Y 101/00* (2016.01)

(56) References Cited

U.S. PATENT DOCUMENTS

| | | | | |
|---|---|---|---|---|
| 2011/0254421 | A1* | 10/2011 | Thomas | F21V 23/002 |
| | | | | 313/46 |
| 2012/0049737 | A1* | 3/2012 | Kitagawa | F21K 9/135 |
| | | | | 315/53 |
| 2012/0051069 | A1* | 3/2012 | Lim | F21V 3/00 |
| | | | | 362/373 |
| 2012/0230027 | A1 | 9/2012 | Boomgaarden et al. | |
| 2012/0293057 | A1* | 11/2012 | Yamamoto | F21V 29/004 |
| | | | | 313/45 |
| 2013/0100674 | A1* | 4/2013 | Kim | F21V 21/00 |
| | | | | 362/249.14 |
| 2013/0114251 | A1* | 5/2013 | Duan | F21V 29/004 |
| | | | | 362/235 |

FOREIGN PATENT DOCUMENTS

| | | | |
|---|---|---|---|
| EP | 2515035 | A2 | 10/2012 |
| JP | 5-48262 | A | 2/1993 |
| WO | WO 2013/009049 | A2 | 1/2013 |
| WO | WO 2013/060510 | A1 | 5/2013 |

* cited by examiner

LIGHTING DEVICE

CROSS-REFERENCE TO RELATED APPLICATION

The present application claims priority under 35 U.S.C. §119(a) of Korean Patent Application No. 10-2013-0036699 filed Apr. 4, 2013 and No. 10-2013-0036700 filed Apr. 4, 2013 the subject matters of which are incorporated herein by reference.

BACKGROUND

1. Field

Embodiments may relate to a lighting device.

2. Background

A light emitting diode (LED) is an energy device for converting electric energy into light energy. Compared with an electric bulb, the LED has higher conversion efficiency, lower power consumption and a longer life span. As the advantages are widely known, more and more attentions are now paid to a lighting apparatus using the LED.

SUMMARY

One embodiment is a lighting device. The lighting device includes: a heat sink; a light source module which is disposed on the heat sink, includes a substrate having at least one hole, and includes a plurality of light emitting devices disposed on a top surface of the substrate; a power supply unit which is disposed within the heat sink and includes a support plate and a plurality of parts disposed on the support plate; and a soldering portion which connects the substrate and the support plate. The support plate includes an extended substrate which is disposed in the hole of the substrate. The extended substrate includes a through-portion which has passed through the hole of the substrate. The soldering portion electrically connects the through-portion of the extended substrate and the top surface of the substrate.

Another embodiment is a lighting device. The lighting device includes: a heat sink; a light source module which is disposed on the heat sink and includes a substrate and a plurality of light emitting devices disposed on a top surface of the substrate; a power supply unit which is disposed within the heat sink and includes a support plate and a plurality of parts disposed on the support plate; and a base which supplies external power to the power supply unit. The heat sink includes a receiver receiving the power supply unit and includes a connection portion which is coupled to the base. The support plate of the power supply unit includes a protrusion. The connection portion of the heat sink has a connection recess into which the protrusion of the support plate is inserted.

Further another embodiment is a lighting device. The lighting device includes: a heat sink; a light source module which is disposed on the heat sink and includes a substrate and a plurality of light emitting devices disposed on a top surface of the substrate; and a power supply unit which is disposed within the heat sink and includes a support plate and a plurality of parts disposed on the support plate. The heat sink includes a receiver receiving the power supply unit, and a first and a second guides which are disposed in the receiver and guide both sides of one edge of the support plate respectively. An interval between the first guide and the second guide is reduced toward the inside of the receiver of the heat sink.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

Figure 1:
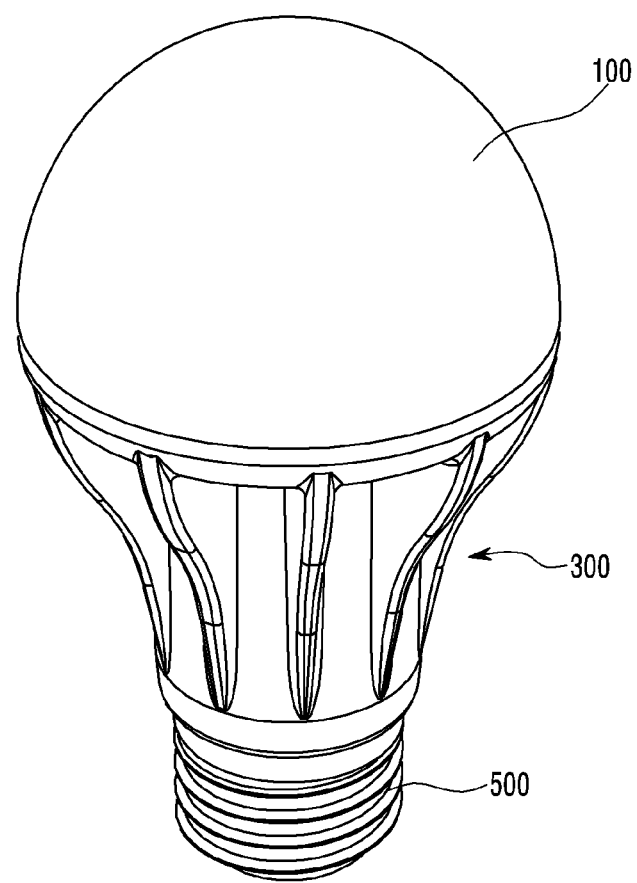
FIG. 1 is a top perspective view of a lighting device according to a first embodiment.
Figure 2:
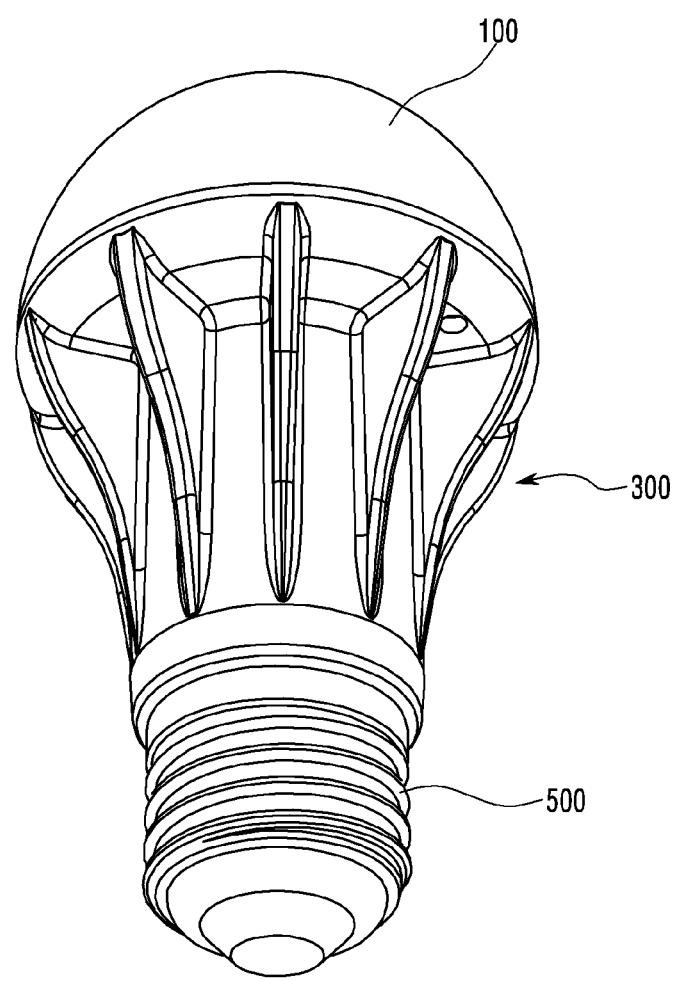
FIG. 2 is a bottom perspective view of the lighting device shown in FIG. 1.
Figure 3:
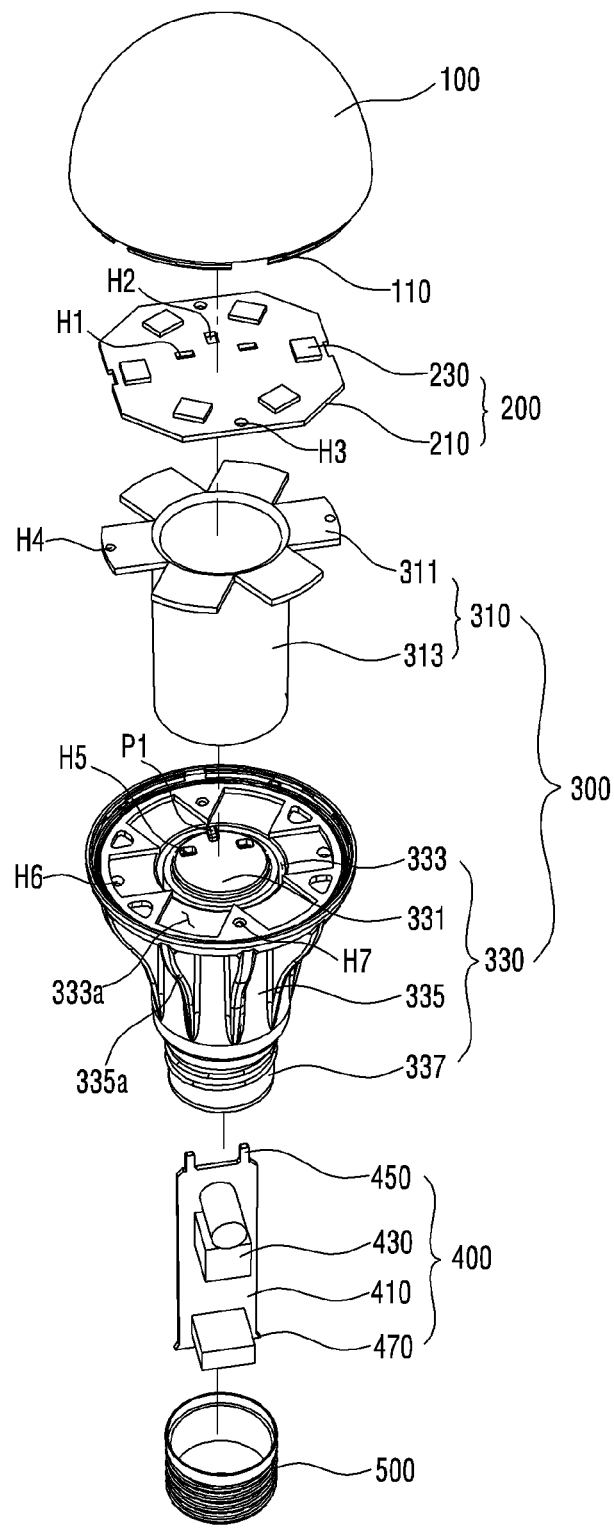
FIG. 3 is an exploded perspective view of the lighting device shown in FIG. 1.
Figure 4:
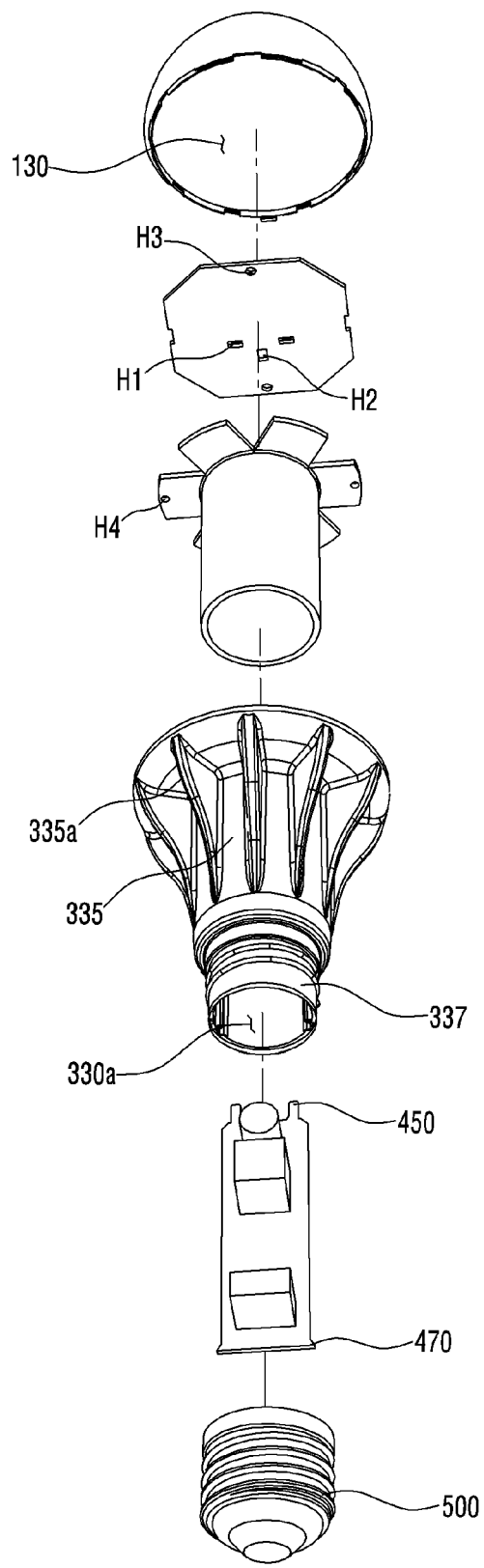
FIG. 4 is an exploded perspective view of the lighting device shown in FIG. 2.
Figure 5:
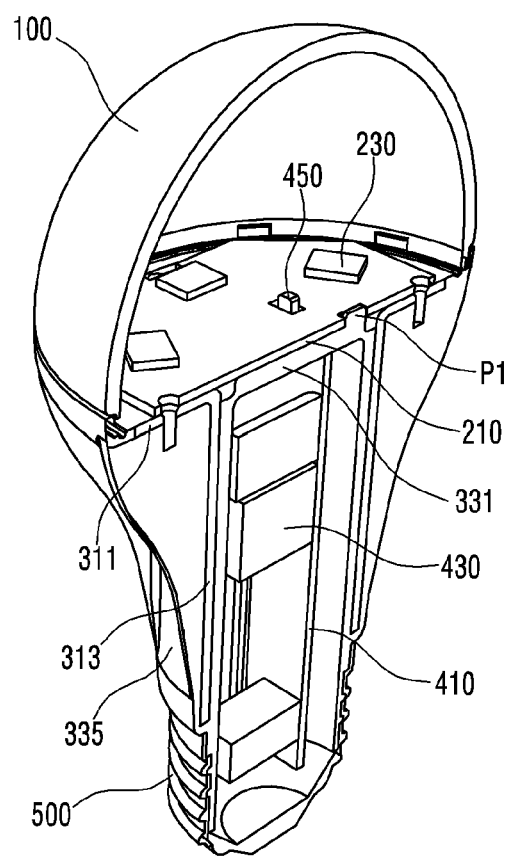
FIG. 5 is a cross sectional view of the lighting device shown in FIG. 1.

FIG. 1 is a top perspective view of a lighting device according to a first embodiment. FIG. 2 is a bottom perspective view of the lighting device shown in FIG. 1. FIG. 3 is an exploded perspective view of the lighting device shown in FIG. 1. FIG. 4 is an exploded perspective view of the lighting device shown in FIG. 2. FIG. 5 is a cross sectional view of the lighting device shown in FIG. 1.

Referring to FIGS. 1 to 5, the lighting device according to the first embodiment may include a cover 100, a light source module 200, a heat sink 300, a power supply unit 400, and a base 500. Hereafter, the respective components will be described in detail.

<Cover 100>

The cover 100 has a hemispherical shape or a bulb shape, and includes an opening 130.

The cover 100 is disposed on the light source module 200 and is optically coupled to the light source module 200. For example, the cover 100 may diffuse, scatter or excite light emitted from the light source module 200.

The cover 100 is coupled to the heat sink 300. Specifically, the cover 100 may be coupled to a second heat radiation part 330.

The cover 100 may include a coupling portion 110. The coupling portion 110 may be coupled to the heat sink 300. Specifically, the coupling portion 110 is formed to protrude from an end of the cover 100, which forms the opening 130. A plurality of the coupling portions 110 may be provided. The plurality of the coupling portions 110 may be spaced apart from each other at a predetermined interval instead of being connected to each other. As such, when the plurality of the coupling portions 110 are spaced apart from each other at a predetermined interval, it is possible to prevent the coupling portion 110 from being damaged due to a force (a horizontal pressure or tension) generated at the time of inserting and fixing the coupling portion 110 to the heat sink 300.

Though not shown in the drawings, the coupling portion 110 may have a screw thread-shaped coupling structure corresponding to a screw groove structure of the heat sink 300. Due to the screw groove structure of the second heat sink 300 and the screw thread structure of the coupling portion 110, the cover 100 and the heat sink 300 are easily coupled to each other, thereby improving the work efficiency.

The material of the cover 100 may be a polycarbonate (PC) used to diffuse light for the purpose of preventing a user from feeling glare caused by light emitted from the light source module 200. Moreover, the cover 100 may be formed of any one of glass, plastic, polypropylene (PP), and polyethylene (PE).

The inner surface of the cover 100 may be anti-corrosion treated, and a predetermined pattern may be applied on the outer surface of the cover 100. The cover 100 may scatter the light emitted from the light source module 200, thereby preventing a user from feeling glare.

The cover 100 may be manufactured by a blow molding process for the sake of rear light distribution.

<Light Source Module 200>

The light source module 200 includes a light emitting device 230 which emits predetermined light.

The light source module 200 is disposed on the heat sink 300.

The light source module 200 may include a substrate 210 and the light emitting device 230 disposed on the substrate 210.

The substrate 210 may be formed by printing a circuit pattern on an insulator. For example, the substrate 210 may include a printed circuit board (PCB), a metal core PCB, a flexible PCB, a ceramic PCB and the like.

The substrate 210 may be formed by printing a predetermined circuit pattern on a transparent or opaque resin. Here, the resin may be a thin insulating sheet having the circuit pattern.

The substrate 210 may have a polygonal plate shape. However, there is no limit to this. The substrate 210 may have a circular plate shape, an elliptical plate shape and other various plate shapes.

The surface of the substrate 210 may be coated with a material capable of efficiently reflecting light or may be coated with a color, for example, white, silver and the like.

The substrate 210 may have a first hole H1 allowing the substrate 210 to be coupled to the power supply unit 400. Specifically, this will be described with reference to FIGS. 6 to 8.

Figure 6:
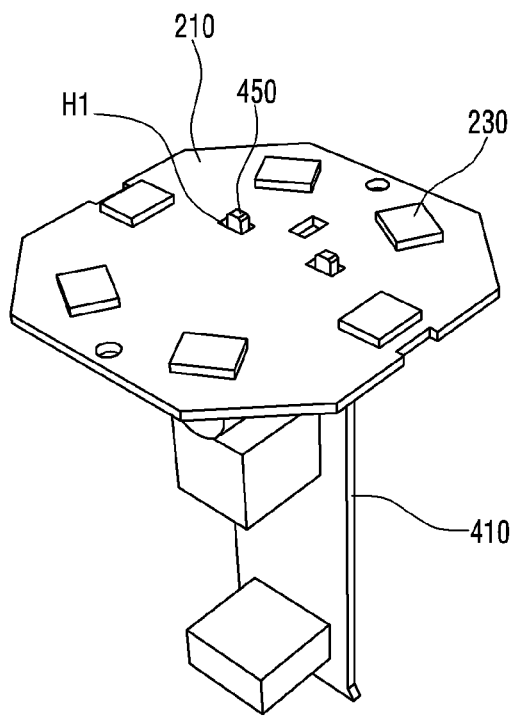
FIG. 6 is a perspective view showing a state where a light source module and a power supply unit shown in FIG. 3 have been coupled to each other.
Figure 7:
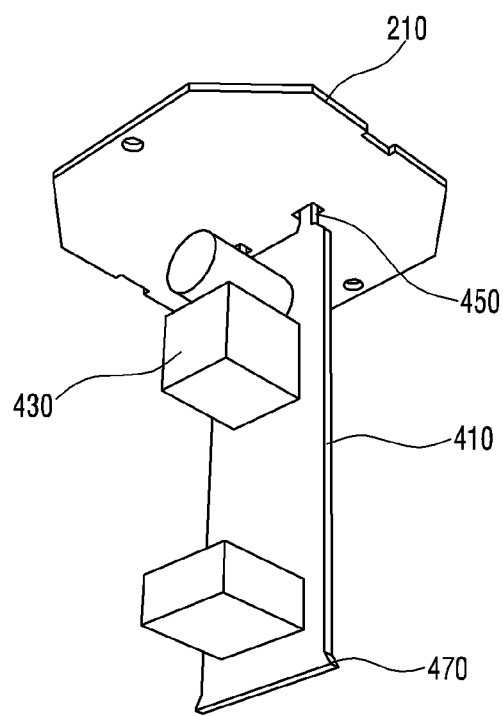
FIG. 7 is a perspective view showing a state where a light source module and a power supply unit, which are shown in FIG. 4, have been coupled to each other.
Figure 8:
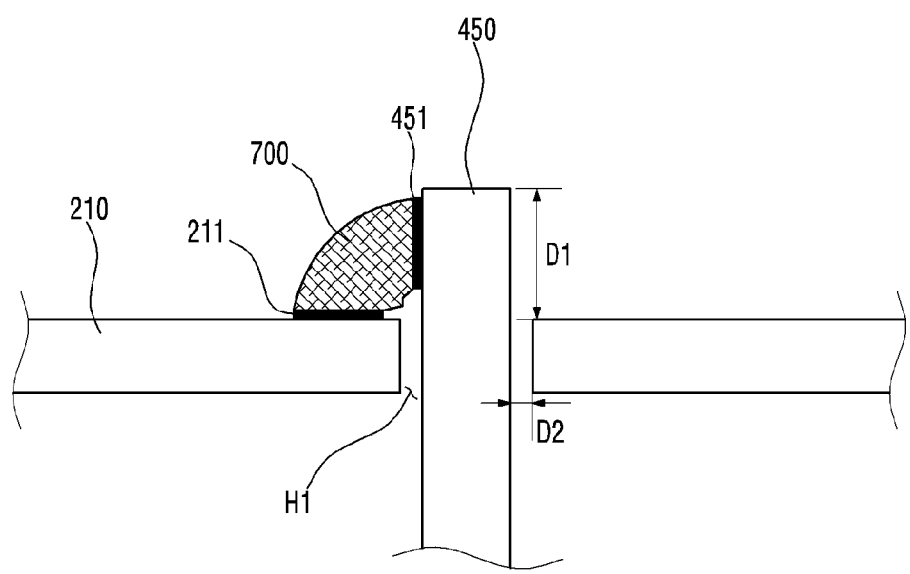
FIG. 8 is a conceptual diagram for describing an electrical connection between a substrate and an extended substrate which are shown in FIGS. 3 and 4.

FIG. 6 is a perspective view showing a state where the light source module 200 and the power supply unit 400 shown in FIG. 3 have been coupled to each other. FIG. 7 is a perspective view showing a state where the light source module 200 and the power supply unit 400, which are shown in FIG. 4, have been coupled to each other. FIG. 8 is a conceptual diagram for describing an electrical connection between the substrate 210 and an extended substrate 450 which are shown in FIGS. 3 and 4.

Referring to FIGS. 3 to 8, the substrate 210 has the first hole H1. The extended substrate 450 of the power supply unit 400 is disposed in the first hole H1.

A height D1 from the top surface of the substrate 210 to the end of the extended substrate 450 which has passed through the first hole H1 of the substrate 210, that is to say, a length D1 of a portion of the extended substrate 450, which has passed through the first hole H1 of the substrate 210 may be from 1.5 mm to 2.0 mm. If the D1 is less than 1.5 mm, it is difficult to electrically connect the substrate 210 and the extended substrate 450, so that poor contact may occur between the substrate 210 and the extended substrate 450. Specifically, the electrical connection between the substrate 210 and the extended substrate 450 can be performed by soldering. For the sake of the soldering process, a terminal 211 of the substrate 210 and a terminal 451 of the extended substrate 450 are required to contact with a soldering portion 700. If the D1 is less than 1.5 mm, it is difficult for the terminal 451 of the extended substrate 450 to sufficiently contact with the soldering portion 700. In this case, the poor contact may occur between the substrate 210 and the extended substrate 450. Therefore, it is recommended that the D1 should be greater than 1.5 mm. If the D1 is greater than 2.0 mm, a dark portion may be generated at the time of driving the light source module 200. Specifically, the dark portion may be generated in the vicinity of the extended substrate 450. The dark portion may degrade an optical efficiency of the lighting device and give an unpleasant appearance to users. Therefore, it is recommended that the D1 should be than 2.0 mm.

The shape of the first hole H1 may correspond to the shape of the extended substrate 450. Here, the diameter of the first hole H1 may be larger than the diameter of the extended substrate 450. That is, the size of the first hole H1 may be so large that the extended substrate 450 is inserted into the first hole H1. Therefore, the extended substrate 450 inserted into the first hole H1 may not contact with the substrate 210. In the first hole H1, an interval D2 between the substrate 210 and the extended substrate 450 may be greater than 0 and equal to or less than 0.2 mm. If the D2 is 0, the it may be difficult to insert the extended substrate 450 into the first hole H1 of the substrate 210, and an unintended electrical short-circuit may occur between the extended substrate 450 and the substrate 210. On the other hand, if the D2 is greater than 0.2 mm, soldering materials may pass through the first hole H1 and flow down to a support plate 410 while performing the soldering process. In this case, a printed circuit formed in the support plate 410 may be electrically short-circuited by the soldering materials, and it may be difficult to accurately place the extended substrate 450 at a point where the extended substrate 450 is expected to be disposed in the first hole H1. Therefore, it is recommended that the D2 should be greater than 0 and equal to or less than 0.2 mm.

Referring back to FIGS. 3 to 5, the substrate 210 may have a second hole H2 for identifying the exact location of the substrate 210 at the time of mounting the substrate 210 in the heat sink 300. A protrusion P1 of the heat sink 300 is disposed in the second hole H2. The protrusion P1 is disposed on the top surface of an inner portion 331 of the heat sink 300. The protrusion P1 is able to guide the location of the substrate 210 in the heat sink 300.

The substrate 210 may have a third hole H3 for fixing the substrate 210 to the heat sink 300. A coupling means like a screw, passes through the third hole H3 of the substrate 210 and is inserted into a seventh hole H7 of the heat sink 300, thereby fixing the substrate 210 to the heat sink 300.

A plurality of the light emitting devices 230 may be disposed on one side of the substrate 210. Here, the light emitting device 230 may be disposed on a predetermined area of the substrate 210 disposed on an upper portion 311 of the heat sink 300. That is, the light emitting device 230 may be disposed on the substrate 210, in particular, on the upper portion 311 of the heat sink 300. As such, when the light emitting device 230 is disposed on the upper portion 311 of the heat sink 300, heat which is radiated from the light emitting device 230 may quickly move to the upper portion 311 of the heat sink 300. Therefore, heat radiation performance can be more improved.

The number of the light emitting devices 230 may be equal to or less than that of the upper portions 311 of the heat sink 300. Specifically, the light emitting devices 230 may one-to-one correspond to the upper portion 311 of the heat sink 300. Otherwise, the number of the light emitting devices 230 may be less than that of the upper portions 311 of the heat sink 300.

The light emitting device 230 may be a light emitting diode chip emitting red, green and blue light or a light emitting diode chip emitting ultraviolet light. Here, the light emitting diode chip may have a lateral type or vertical type.

The light emitting device 230 may be a high-voltage (HV) LED package. A HV LED chip within the HV LED package is driven by a DC power supplier and is turned on at a voltage higher than 20V. The HV LED package has a high power consumption of about 1 W. For reference, a conventional common LED chip is turned on at a voltage of 2V to 3V. Since the light emitting device 230 which is the HV LED package has the high power consumption of about 1 W, the performance equivalent to or similar to that of the conventional common LED chip can be obtained only by a small number of the light emitting devices 230, so that it is possible to reduce the production cost of the lighting device according to the embodiment.

A lens may be disposed on the light emitting device 230. The lens is disposed to cover the light emitting device 230. The lens is able to adjust the orientation angle or direction of the light emitted from the light emitting device 230. The lens has a hemispherical shape and may be formed of a light-transmitting resin such as a silicone resin or an epoxy resin without an empty space. The light-transmitting resin may include a wholly or partially distributed phosphor.

When the light emitting device 230 is a blue light emitting diode, the phosphor included in the light-transmitting resin may include at least one of garnet based phosphor (YAG, TAG), silicate based phosphor, nitride based phosphor and oxynitride based phosphor.

It is possible to create natural sunlight (white light) by including only yellow phosphor to the light-transmitting resin. Additionally, green phosphor or red phosphor may be further included in order to improve a color rendering index and to reduce a color temperature.

When many kinds of fluorescent materials are mixed in the light-transmitting resin, an addition ratio of the color of the phosphor may be formed such that the green phosphor is more used than the red phosphor, and the yellow phosphor is more used than the green phosphor. The garnet based phosphor (YAG), the silicate based phosphor and the oxynitride based phosphor may be used as the yellow phosphor. The silicate based phosphor and the oxynitride based phosphor may be used as the green phosphor. The nitride based phosphor may be used as the red phosphor. The light-transmitting resin may be mixed with various kinds of the phosphors or may be configured by a layer including the red phosphor, a layer including the green phosphor and a layer including the yellow phosphor, which are formed separately from each other.

<Heat Sink 300>

The heat sink 300 receives heat radiated from the light source module 200 and radiates the heat. The heat sink 300 may receive heat radiated from the power supply unit 400 and radiate the heat.

The heat sink 300 may include a first heat radiation part 310 and the second heat radiation part 330.

The material of the first heat radiation part 310 may be different from that of the second heat radiation part 330. Specifically, the first heat radiation part 310 may be formed of a non-insulating material, and the second heat radiation part 330 may be formed of an insulating material. The first heat radiation part 310 formed of the non-insulating material is able to quickly radiate the heat emitted from the light source module 200. The outer surface of the heat sink 300 becomes insulating due to the second heat radiation part 330 formed of the insulating material, thereby improving a withstand voltage characteristic of the lighting device and protecting a user from electrical energy. For example, the first heat radiation part 310 may be formed of a metallic material such as aluminum, copper, magnesium and the like, and the second heat radiation part 330 may be formed of a resin material such as Polycarbonate (PC), and Acrylonitrile (AN), Butadiene (BD) and styrene (SM) (ABS), and the like. Here, the resin-made second heat radiation part 330 may include metal powder. It is easier to form the external appearance of the resin-made second heat radiation part 330 than to form the external appearance of a conventional metallic heat sink. Also, poor appearance caused by coating or anodizing the conventional heat sink does not occur in the resin-made second heat radiation part 330.

A first thermal conductivity (W/(mk) or W/m ° C.) of the material constituting the first heat radiation part 310 may be greater than a second thermal conductivity of the material constituting the second heat radiation part 330. Since the light source module 200 is disposed closer to the first heat radiation part 310 than to the second heat radiation part 330, when the thermal conductivity of the first heat radiation part 310 is greater than the thermal conductivity of the second heat radiation part 330, it is advantageous for the improvement of heat radiation performance. For example, the first heat radiation part 310 may be formed of aluminum having a high thermal conductivity, and the second heat radiation part 330 may be formed of polycarbonate (PC) having a thermal conductivity less than that of the first heat radiation part 310. Here, the first heat radiation part 310 is not limited to the aluminum, and the second heat radiation part 330 is not limited to the PC.

The light source module 200 is disposed on the first heat radiation part 310. Specifically, the substrate 210 and the light emitting devices 230 of the light source module 200 may be disposed on the upper portion 311 of the first heat radiation part 310.

The first heat radiation part 310 may include the upper portion 311 and a lower portion 313.

The upper portion 311 may have a flat plate shape. The substrate 210 and the light emitting devices 230 of the light source module 200 are disposed on the upper portion 311, so that the upper portion 311 receives directly the heat from the light source module 200. The upper portion 311 may radiate the heat received from the light source module 200 to the outside or transfer to the lower portion 313.

The shape of the upper portion 311 is not limited to the flat plate shape. For example, the shape of the upper portion 311 may be a plate shape of which a portion, especially, the central portion is upwardly or downwardly convex or may be a hemispherical shape. Also, the upper portion 311 may have various shapes such as a circular shape, an elliptical shape or the like.

The upper portion 311 may extend from the top of the lower portion 313 in a direction almost perpendicular to the longitudinal direction of the lower portion 313. Here, the upper portion 311 and the lower portion 313 may be perpendicular to each other or may form an acute angle or an obtuse angle therebetween.

A plurality of the upper portions 311 may be provided. The plurality of the upper portions 311 may be disposed radially around the top of the lower portion 313.

The number of the upper portions 311 may be equal to or greater than that of the light emitting devices 230. The substrate 210 and the light emitting devices 230 may be disposed on the each upper portion 311.

A fourth hole H4 for fixing the first heat radiation part 310 to the second heat radiation part 330 may be formed in at least two of the plurality of the upper portions 311. A coupling means (not shown) like a screw may pass through the fourth hole H4 and be inserted into a sixth hole H6 of the second heat radiation part 330.

The upper portion 311 may be disposed on an outer portion 335 of the second heat radiation part 330. Specifically, the upper portion 311 may be disposed on the top surface of the outer portion 335 of the second heat radiation part 330.

The upper portion 311 may be disposed on a cavity 333a of the second heat radiation part 330. The number of the upper portions 311 may be equal to the number of the cavities 333a. Here, the cavity 333a is a portion of a first receiver 333 of the second heat radiation part 330. The cavity 333a may be a recess dug downward from the top surface of the outer portion 335 of the second heat radiation part 330.

A heat radiating plate (not shown) or a thermal grease may be disposed between the upper portion 311 and the substrate 210 of the light source module 200 in order to quickly conduct the heat from the light source module 200 to the upper portion 311.

The lower portion 313 may be disposed within the second heat radiation part 330. Specifically, the lower portion 313 may be disposed in the first receiver 333 of the second heat radiation part 330. When the lower portion 313 is disposed in the first receiver 333 of the second heat radiation part 330, the metallic lower portion 313 does not form the appearance of the lighting device according to the first embodiment. Accordingly, it is possible to protect users from electrical energy generated from the power supply unit 400. Since a heat sink of an existing lighting device is fully formed of a metallic material and the outer surface of the existing lighting device is formed of a metallic material, electrical energy caused by an inner power supply unit might affect the user.

The lower portion 313 may be disposed between the inner portion 331 and the outer portion 335 of the second heat radiation part 330. When the lower portion 313 is disposed between the inner portion 331 and the outer portion 335 of the second heat radiation part 330, the metallic lower portion 313 does not form the appearance of the lighting device according to the first embodiment. Accordingly, it is possible to protect users from electrical energy generated from the power supply unit 400.

The lower portion 313 may have a tubular shape with an empty interior or may have a pipe shape. Specifically, the lower portion 313 may have a cylindrical shape, an elliptical tubular shape or a polygonal box shape. The tubular shaped-lower portion 313 may have a constant diameter. Specifically, the diameter of the lower portion 313 may be constant from the top to the bottom of the lower portion 313. With the constant diameter of the lower portion 313 in manufacturing the lighting device according to the first embodiment, it may be possible to easily couple and separate the first heat radiation part 310 to and from the second heat radiation part 330.

The lower portion 313 may have a top opening and a bottom opening.

The lower portion 313 may have a predetermined length along the longitudinal direction of the second heat radiation part 330. The length of the lower portion 313 may extend from the top to the bottom of the second heat radiation part 330 or may extend from the top to the middle of the second heat radiation part 330. Therefore, the length of the lower portion 313 is not limited to what is shown in the drawings. The heat radiation performance may be enhanced with the increase of the length of the lower portion 313.

A fin or an embossed structure may be further included on at least one of the outer surface and the inner surface of the lower portion 313. When the fin or the embossed structure is included on the lower portion 313, the surface area of the lower portion 313 itself is increased, so that the heat radiating area is increased. As a result, the heat radiation performance of the heat sink 300 can be improved.

The upper portion 311 and the lower portion 313 may be integrally formed with each other. In the present specification, it may mean that the individual upper portion 311 and the individual lower portion 313 are not connected by welding or bonding them, but the upper portion 311 and the lower portion 313 are connected as one to each other without being physically separated. When the upper portion 311 and the lower portion 313 are integrally formed with each other, the contact resistance between the upper portion 311 and the lower portion 313 is close to 0. Therefore, a heat transfer rate from the upper portion 311 to the lower portion 313 is higher than that when the upper portion 311 and the lower portion 313 are not integrally formed with each other. Also, when the upper portion 311 and the lower portion 313 are integrally formed with each other, a process of coupling them, for example, a press processing and the like, is not required, so that the cost in the manufacturing process can be reduced.

The total surface area of the plurality of the upper portions 311 may be equal to or greater than the surface area of the lower portion 313. Specifically, the total surface area of the plurality of the upper portions 311 may be equal to or greater than 1 time and equal to or less than 2 times the surface area of the lower portion 313. If the total surface area of the plurality of the upper portions 311 is less than 1 time the surface area of the lower portion 313, a heat transfer efficiency may be deteriorated because the total surface area of the upper portions 311 which directly receives from the light source module 200 is less than the surface area of the lower portion 313. Meanwhile, if the total surface area of the plurality of the upper portions 311 is greater than 2 times the surface area of the lower portion 313, most of the heat is gathered in the upper portion 311, so that heat radiation efficiency may be deteriorated.

The first heat radiation part 310, that is to say, the upper portion 311 and the lower portion 313 may be manufactured by the following method.

A cylindrical aluminum (Al) pipe is provided and is cut by a designer's favorite length. One end of the cut aluminum pipe is cut by a predetermined length toward the other end in the longitudinal direction of the aluminum pipe. The cutting process is repeated as many as the number of the upper portions 311. Finally, the cut portions of the aluminum pipe are bent outwardly. As a result, the first heat radiation part 310 of the lighting device according to the first embodiment is completed.

The second heat radiation part 330, together with the cover 100, may form the appearance of the lighting device according to the first embodiment and may receive the first heat radiation part 310 and the power supply unit 400.

The first heat radiation part 310 is disposed within the second heat radiation part 330. Specifically, the second heat radiation part 330 may include the first receiver 330 receiving the first heat radiation part 310. Here, the first receiver 330 may have the cavity 333a receiving the plurality of the upper portions 311 of the first heat radiation part 310 respectively.

The first receiver 333 is formed between the inner portion 331 and the outer portion 335 of the second heat radiation part 330, and may have a predetermined depth as much as the length of the lower portion 313.

The second heat radiation part 330 may include a second receiver 330a receiving the power supply unit 400. Here, unlike a receiver of the heat sink of a conventional lighting device, the second receiver 330a is formed of a non-insulating resin material. Therefore, the power supply unit 400 received in the second receiver 330a can be used as a non-insulating PSU. The manufacturing cost of the non-insulating PSU is lower than that of an insulating PSU, so that the manufacturing cost of the lighting device can be reduced.

The second heat radiation part 330 may include the inner portion 331, the outer portion 335, and a connection portion 337.

The inner portion 331 of the second heat radiation part 330 is enclosed by the first heat radiation part 310. Here, the inner portion 331 of the second heat radiation part 330 has a shape corresponding to the appearance of the first heat radiation part 310.

The substrate 210 of the light source module 200 is disposed on the inner portion 331.

The inner portion 331 is disposed in the lower portion 313 of the first heat radiation part 310 and in the top opening of the lower portion 313. The inner portion 331 may have the second receiver 330a receiving the power supply unit 400.

The inner portion 331 may have a fifth hole H5 through which the extended substrate 450 of the power supply unit 400 disposed in the second receiver 330a passes.

The protrusion P1 which is inserted into the second hole H2 of the substrate 210 may be disposed on the top surface of the inner portion 331.

The outer portion 335 of the second heat radiation part 330 encloses the first heat radiation part 310. Here, the outer portion 335 of the second heat radiation part 330 may have a shape corresponding to the appearance of the first heat radiation part 310.

The upper portion of the first heat radiation part 310, and the substrate 210 and the light emitting device 230 of the light source module 200 are sequentially disposed on the outer portion 335.

The outer portion 335 may have the cavity 333a in which the upper portion 311 of the first heat radiation part 310 is disposed.

The outer portion 335 may have the sixth hole H6 for fixing the upper portion 311 of the first heat radiation part 310 and the seventh hole H7 for fixing the substrate 210 of the light source module 200.

The outer portion 335 may have a fin 335a. The fin 335a increases the surface area of the outer portion 335 of the second heat radiation part 330, so that the heat radiation performance of the heat sink 300 can be improved.

The connection portion 337 of the second heat radiation part 330 may be connected to the lower portions of the inner portion 331 and the outer portion 335. The connection portion 337 is coupled the base 500. The connection portion 337 may have a screw thread corresponding to a screw groove formed in the base 500. The connection portion 337, together with the inner portion 331, may form the second receiver 330a.

The connection portion 337 is coupled to the power supply unit 400, and thereby fixing the power supply unit 400 within the second receiver 330a. Hereafter, this will be described with reference to FIG. 9.

Figure 9:
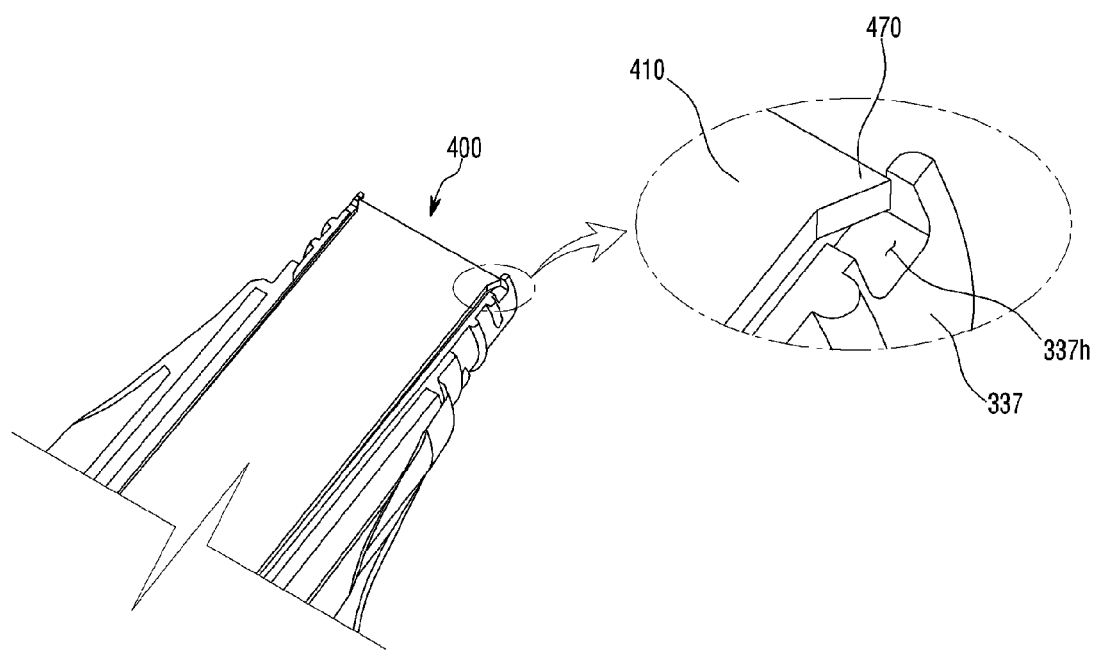
FIG. 9 is a view for describing a coupling structure between a connection portion and the power supply unit.

FIG. 9 is a view for describing a coupling structure between the connection portion 337 and the power supply unit 400.

Referring to FIG. 9, the connection portion 337 has a coupling recess 337h. The coupling recess 337h has a predetermined diameter allowing a protrusion 470 of the support plate 410 to be inserted into the coupling recess 337h. The protrusion 470 may be formed in accordance with the number of the protrusions 470 of the support plate 410.

The support plate 410 of the power supply unit 400 has the protrusion 470 which is coupled to the coupling recess 337h of the connection portion 337. The protrusion 470 may extend outwardly from both corners of the lower portion of the support plate 410. The protrusion 470 has a shape in such manner that it is easy for the support plate 410 to be received in the second receiver 330a and it is hard for the support plate 410 to come out of the second receiver 330a. For example, the protrusion 470 may have a hook shape.

When the protrusion 470 of the support plate 410 is coupled to the coupling recess 337h of the connection portion 337, it is hard for the support plate 410 to come out of the second receiver 330a, thereby firmly fixing the support plate 410 within the second receiver 330a. Therefore, a separate additional process, for example, a molding process of the power supply unit 400 is not required, so that the manufacturing cost of the lighting device can be reduced.

Referring back to FIGS. 1 to 5, the first receiver 333 of the second heat radiation part 330 is formed between the inner portion 331 and the outer portion 335 of the second heat radiation part 330, and receives the first heat radiation part 310. The first receiver 333 may have a predetermined depth as much as the length of the lower portion 313 of the first heat radiation part 310. Here, the first receiver 333 does not completely separate the inner portion 331 and the outer portion 335. That is, it is intended that the first receiver 333 is not formed between the lower portion of the inner portion 331 and the lower portion of the outer portion 335, so that the inner portion 331 and the outer portion 335 may be connected to each other.

After the first heat radiation part 310 and the second heat radiation part 330 are separately produced, the first heat radiation part 310 may be coupled to the second heat radiation part 330. Specifically, the lower portion 313 of the first heat radiation part 310 is inserted into the first receiver 333 of the second heat radiation part 330, and the upper portion 311 of the first heat radiation part 310 is inserted into the cavity 333a of the second heat radiation part 330. Then, the first heat radiation part 310 and the second heat radiation part 330 may be coupled to each other through a bonding process or a coupling process.

Meanwhile, the first heat radiation part 310 and the second heat radiation part 330 are integrally formed with each other. Also, the mutually coupled first and second heat radiation parts 310 and 330 may be limited to separate from each other. Specifically, the first heat radiation part 310 and the second heat radiation part 330 are in a state of being stuck together by a predetermined process. Therefore, the first heat radiation part 310 and the second heat radiation part 330 are difficult to separate. Here, it is noted that the first heat radiation part 310 and the second heat radiation part 330 have been separated in FIGS. 3 to 4 for the sake of convenience of the description. In the present specification, it should be understood that the fact that first heat radiation part 310 and the second heat radiation part 330 are integrally formed with each other or limited to separate from each other does not mean that they are not separated by any force, but means that it is possible to separate them by a predetermined force relatively greater than the force of human, for example, a mechanical force, and means that it is difficult to return to the previous state of having been coupled if the first heat radiation part 310 and the second heat radiation part 330 are separated from each other by the predetermined force.

When the first heat radiation part 310 and the second heat radiation part 330 are integrally formed with each other or limited to separate from each other, a contact resistance between the metallic first heat radiation part 310 and the resin made-second heat radiation part 330 may be less than a contact resistance in a case where the first heat radiation part 310 and the second heat radiation part 330 are not integrally formed with each other. Thanks to the reduced contact resistance, it is possible to obtain a heat radiation performance same as or similar to that of the conventional heat sink (entirely formed of a metallic material). Further, when the first and second heat radiation parts 310 and 330 are integrally formed, the breakage and damage of the second heat radiation part 330 caused by external impact can be more reduced than when the first heat radiation part 310 and the second heat radiation part 330 are not integrally formed with each other.

An insert injection process may be used to integrally form the first heat radiation part 310 and the second heat radiation part 330. The insert injection process is formed as follows. After, the previously manufactured first heat radiation part 310 is put into a mold (frame) for molding the second heat radiation part 330, a material constituting the second heat radiation part 330 is molten and put into the mold, and then is injected.

<Power Supply Unit 400>

The power supply unit 400 may include the support plate 410 and a plurality of parts 430.

The support plate 410 mounts the plurality of parts 430. The support plate 410 may receive a power signal supplied through the base 500 and may have a printed pattern through which a predetermined power signal is supplied to the light source module 200.

The support plate 410 may have a quadrangular plate shape. The support plate 410 is received in the second receiver 330a of the second heat radiation part 330. Specifically, this will be described with reference to FIGS. 10 to 11.

Figure 10:
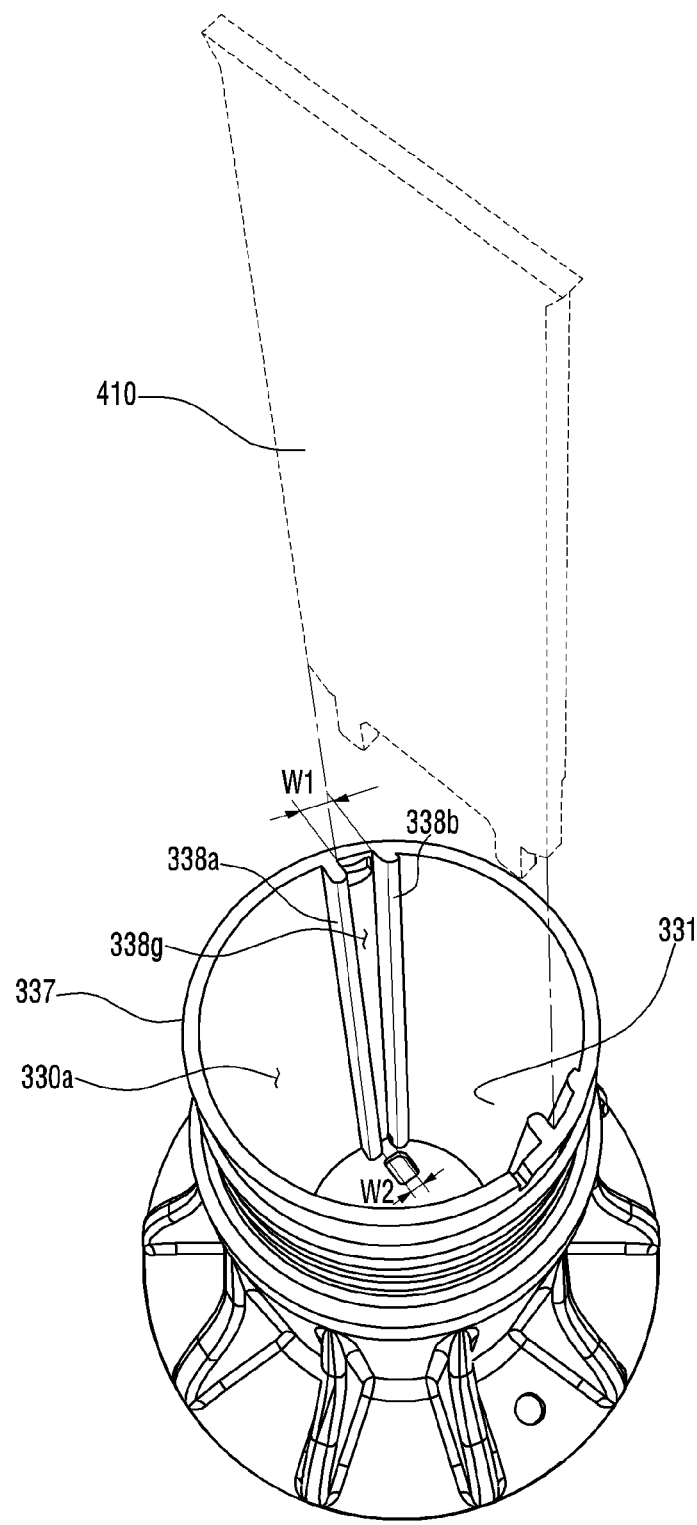
FIGS. 10 to 11 are views for describing a coupling structure between a support plate and a heat sink.
Figure 11:
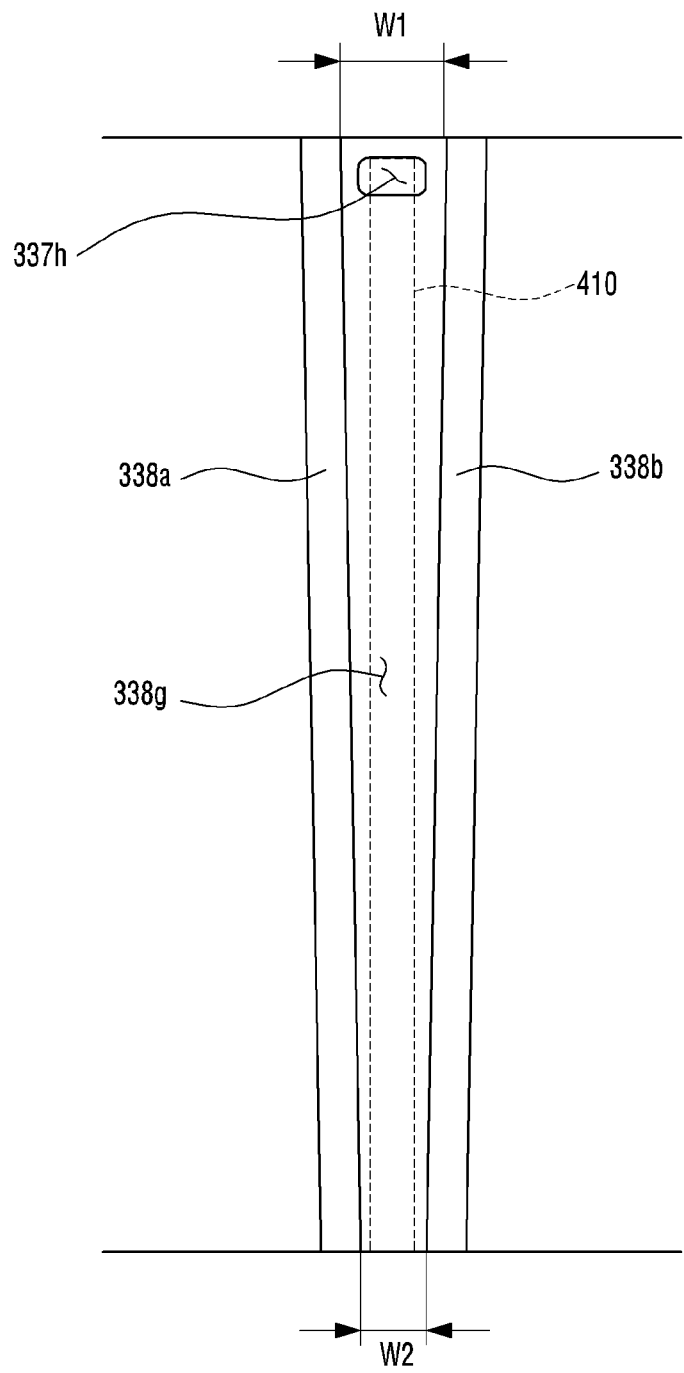

FIGS. 10 to 11 are views for describing a coupling structure between the support plate 410 and the heat sink 300.

Referring to FIGS. 10 to 11, the second heat radiation part 330 may include a first and a second guides 338a and 338b which guide both sides of one edge of the support plate 410 respectively. The first and second guides 338a and 338b are disposed within the second receiver 330a of the heat sink 300. The first and second guides 338a and 338b have a predetermined length toward the bottom surface of the second receiver 330a from the entrance of the second receiver 330a. The first and second guides 338a and 338b may protrude upwardly from the inner surface of the second heat radiation part 330 which forms the second receiver 330a. A guide recess 338g into which one side of the support plate 410 is inserted may be formed between the first guide 338a and the second guide 338b.

An interval between the first guide 338a and the second guide 338b may be reduced toward the inside of the second receiver 330a (W1>W2). In other words, a diameter of the guide recess 338g may be reduced toward the inside of the second receiver 330a (W1>W2). As such, when the interval between the first guide 338a and the second guide 338b or the diameter of the guide recess 338g is reduced toward the inside of the second receiver 330a (W1>W2), a process of inserting the support plate 410 into the second receiver 330a becomes easier, and the support plate 410 can be precisely coupled to the inside of the heat sink 300.

In the entrance of the second receiver 330a, for the purpose of allowing the support plate 410 to be easily inserted into the second receiver 330a, it is recommended that the interval W1 between the first guide 338a and the second guide 338b should be greater than a value obtained by adding 1 mm to the thickness of the support plate 410. In other words, it is recommended that an interval between the first guide 338a and one surface of the support plate 410 should be greater than 0.5 mm.

In the bottom surface of the second receiver 330a, for the purpose of accurately disposing the support plate 410 at a designed position, it is recommended that the interval W2 between the first guide 338a and the second guide 338b should be greater than the thickness of the support plate 410 and less than a value obtained by adding 0.1 mm to the thickness of the support plate 410. In other words, it is recommended that the interval between the first guide 338a and one surface of the support plate 410 should be greater than 0.05 mm.

The coupling recess 337h into which the protrusion 470 of the support plate 410 is inserted is formed between the first guide 338a and the second guide 338b. Since the coupling recess 337h is formed between the first guide 338a and the second guide 338b, the support plate 410 can be disposed at a more accurate position and prevented from being separated.

The support plate 410 may include the extended substrate 450. The extended substrate 450 extends outwardly from the top of the support plate 410. The extended substrate 450 passes through the fifth hole H5 of the heat sink 300 and the first hole H1 of the substrate 210, and then is electrically connected to the substrate 210 through the soldering process.

The support plate 410 may include the protrusion 470. The protrusion 470 extends outwardly from both corners of the lower portion of the support plate 410. The protrusion 470 is coupled to the connection portion 337 of the heat sink 300.

The plurality of the parts 430 are mounted on the support plate 410. The plurality of the parts 430 may include, for example, a DC converter converting AC power supply supplied by an external power supply into DC power supply, a driving chip controlling the driving of the light source module 200, and an electrostatic discharge (ESD) protective device for protecting the light source module 200. However, there is no limit to this.

Since walls defining the second receiver 330a of the second heat radiation part 330 are formed of an insulating material, for example, a resin material, the power supply unit 400 may be the non-insulating PSL. If the power supply unit 400 is the non-insulating PSU, the manufacturing cost of the lighting device can be reduced.

<Base 500>

The base 500 is coupled to the connection portion 337 of the heat sink 300 and is electrically connected to the power supply unit 400. The base 500 transmits external AC power to the power supply unit 400.

The base 500 may have the same size and shape as those of the base of a conventional incandescent bulb. For this reason, the lighting device according to the first embodiment can take the place of the conventional incandescent bulb.

Second Embodiment

Figure 12:
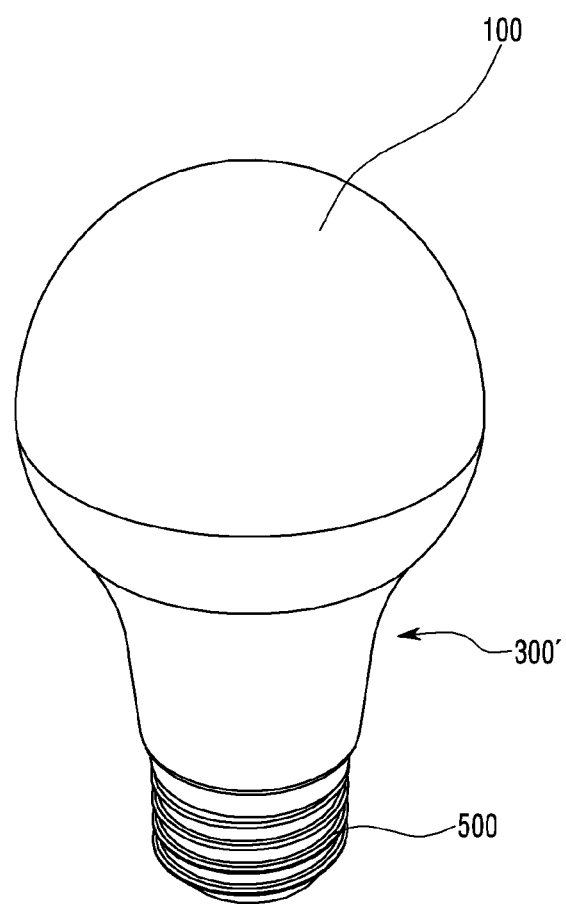
FIG. 12 is a top perspective view of a lighting device according to a second embodiment.
Figure 13:
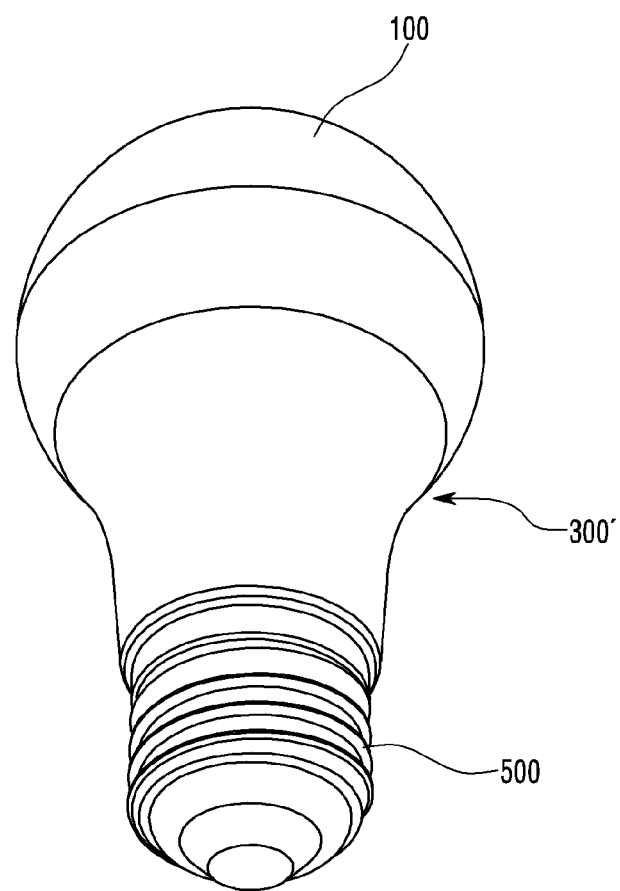
FIG. 13 is a bottom perspective view of the lighting device shown in FIG. 12.
Figure 14:
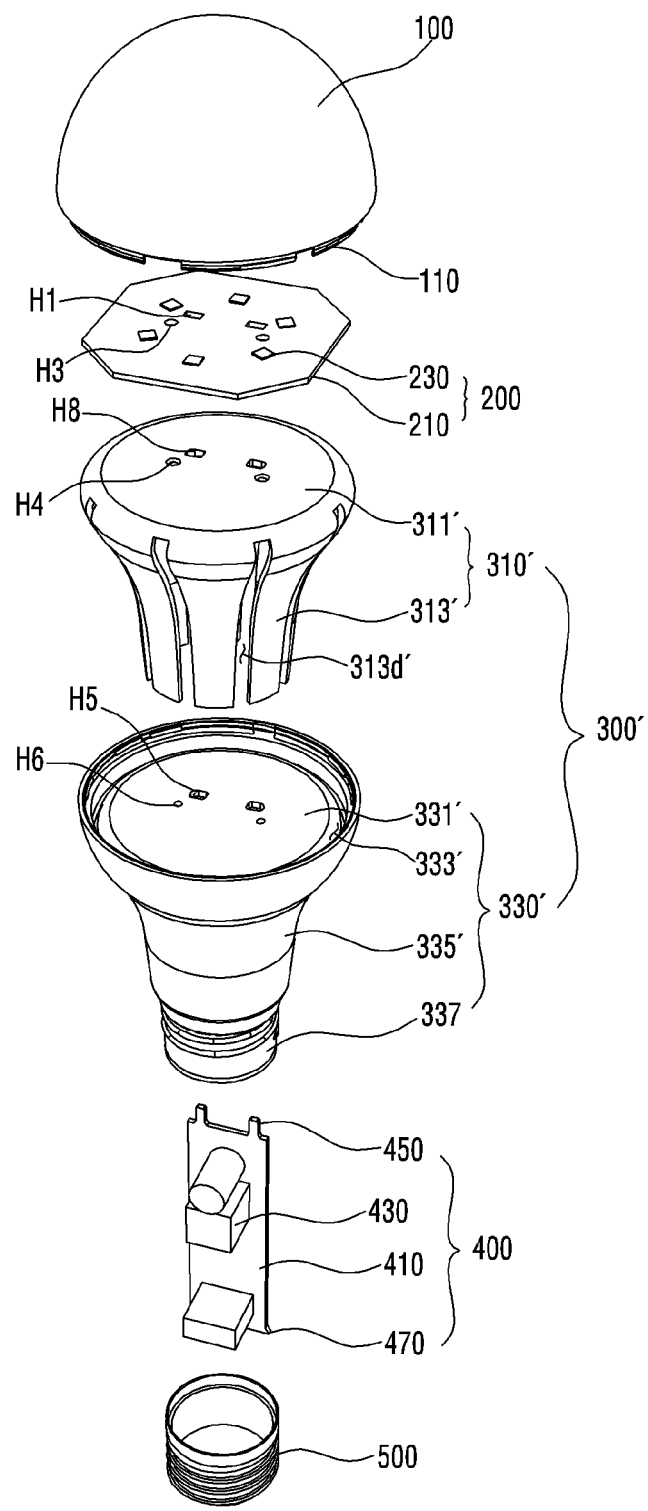
FIG. 14 is an exploded perspective view of the lighting device shown in FIG. 12.
Figure 15:
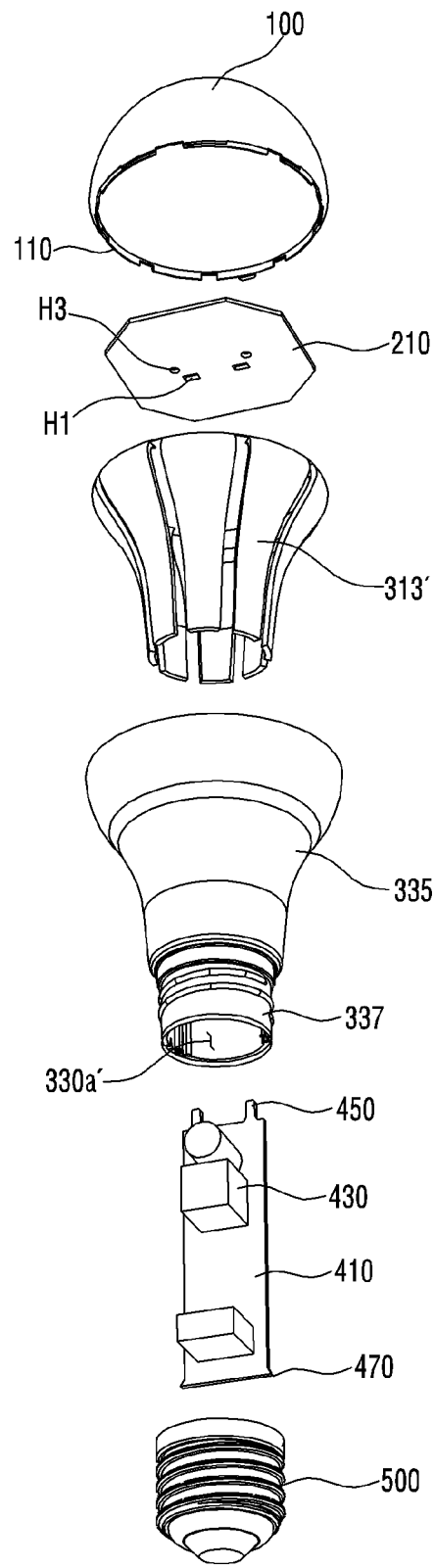
FIG. 15 is an exploded perspective view of the lighting device shown in FIG. 13.
Figure 16:
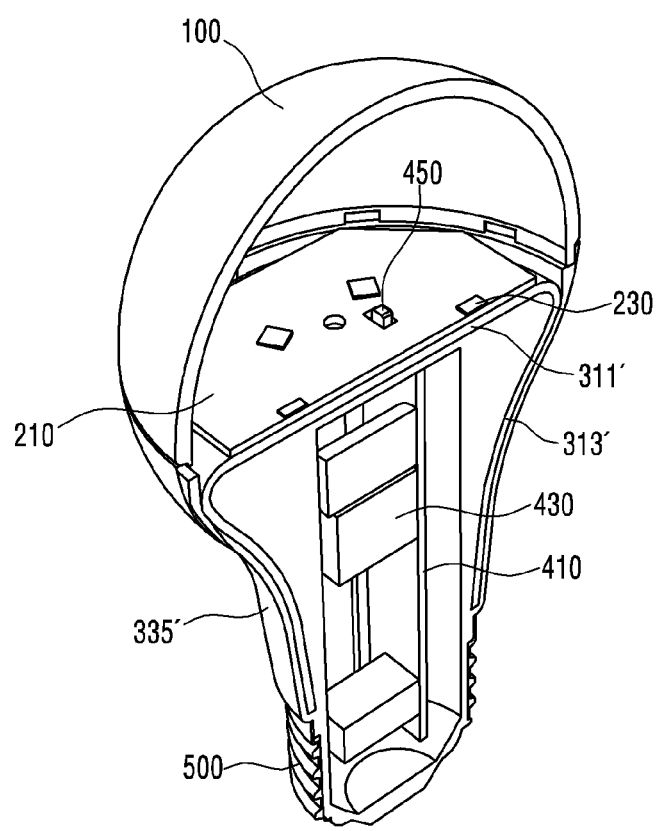
FIG. 16 is a cross sectional view of the lighting device shown in FIG. 12.

FIG. 12 is a top perspective view of a lighting device according to a second embodiment. FIG. 13 is a bottom perspective view of the lighting device shown in FIG. 12. FIG. 14 is an exploded perspective view of the lighting device shown in FIG. 12. FIG. 15 is an exploded perspective view of the lighting device shown in FIG. 13. FIG. 16 is a cross sectional view of the lighting device shown in FIG. 12.

In the lighting device according to the second embodiment shown in FIGS. 12 to 16, the same reference numerals are assigned to the same components as those of the lighting device according to the first embodiment shown in FIGS. 1 to 5. Therefore, in the lighting device according to the second embodiment shown in FIGS. 12 to 16, detailed descriptions of the same components as those of the lighting device according to the first embodiment shown in FIGS. 1 to 5 will be replaced by the foregoing descriptions. Hereafter, a heat sink 300' will be described in detail. The description of the heat sink 300' will focus on a difference between the heat sink 300' and the heat sink 300 according to the first embodiment. It should be understood that the heat sink 300' according to the second embodiment includes the characteristics as they are of the heat sink 300 according to the first embodiment. Also, the heat sink 300' according to the second embodiment shown in FIGS. 12 to 16 may further include the details shown in FIGS. 6 to 11.

The heat sink 300' includes the first heat radiation part 310' and the second heat radiation part 330'. The first heat radiation part 310' may include an upper portion 311' and a lower portion 313'. The second heat radiation part 330' may include an inner portion 331', a first receiver 333', an outer portion 335' and the connection portion 337.

The substrate 210 of the light source module 200 is disposed on the upper portion 311' of the first heat radiation part 310'. The upper portion 311' may have a circular flat plate shape. However, the shape of the upper portion 311' is not limited to this. The upper portion 311' may have a plate shape which is upwardly or downwardly convex, or may have an elliptical or polygonal plate shape.

The upper portion 311' is disposed on the inner portion 331' of the second heat radiation part 330'. The upper portion 311' may have an eighth hole H8 through which the extended substrate 450 of the power supply unit 400 passes.

The lower portion 313' of the first heat radiation part 310' extends downwardly from the edge of the upper portion 311'. A plurality of the lower portions 313' may be provided.

The lower portion 313' may have a flat plate shape or a plate shape of which a portion has a predetermined curvature.

The lower portion 313' may be a plate having a predetermined length. The top and bottom widths of the lower portion 313' may be different from each other. Specifically, the top width of the lower portion 313' may be greater than the bottom width of the lower portion 313'. When the top width of the lower portion 313' is greater than the bottom width of the lower portion 313', the shapes of the plurality of the lower portions 313' can be caused to correspond to the shape of the outer portion 335' of the second heat radiation part 330'.

The lower portion 313' extends downwardly from the edge of the upper portion 311'. A plurality of the lower portions 313' may be provided. The plurality of the lower portions 313' may be spaced apart from each other. A predetermined gap 313d' may be formed between the two adjacent lower portions 313'. The gap 313d' may be created during the manufacturing process of the first heat radiation part 310'. When it is designed that the lower portion of the first heat radiation part is manufactured to have no gap 313d', a drawing process should be used, which requires a lot of manufacturing cost and time. However, since the lower portion 313' of the first heat radiation part 310' has the gap 313d', it is possible to manufacture the lower portion 313' of the first heat radiation part 310' by using a bending method which requires less manufacturing cost and time. Specifically, the manufacturing method of the first heat radiation part 310' is as follows. Development figures of the upper portion 311' and the plurality of the lower portions 313' are previously prepared on an aluminum plate, and then the plurality of the lower portions 313' may be manufactured by bending the aluminum plate.

The number of the lower portion 313' may be changed according to the shape and size of the upper portion 311'. For example, if the shape of the upper portion 311' is circular, the appropriate number of the lower portion 313' may be selected according to the size of the shape of the upper portion 311'. If the shape of the upper portion 311' is polygonal, the number of the lower portions 313' may be selected according to the number of the sides of the polygon.

The surface area of the upper portion 311' may be equal to or greater than the total surface area of the plurality of the lower portions 313'. Specifically, the surface area of the upper portion 311' may be equal to or greater than 1 time and equal to or less than 2 times the total surface area of the plurality of the lower portions 313'. If the surface area of the upper portion 311' is less than 1 time the total surface area of the plurality of the lower portions 313', a heat transfer efficiency may be deteriorated because the surface area of the upper portions 311' which directly receives the heat from the light source module 200 is less than the total surface area of the plurality of the lower portions 313'. Meanwhile, if the surface area of the upper portion 311' is greater than 2 times the total surface area of the plurality of the lower portions 313', most of the heat is gathered in the upper portion 311', so that heat radiation efficiency may be deteriorated.

The lower portion 313' is received in the first receiver 333' of the second heat radiation part 330'.

The shape of the lower portion 313' may correspond to an outer surface shape of the outer portion 335' of the second heat radiation part 330'. Specifically, the lower portion 313' may have a predetermined curvature in accordance with the shape of the outer portion 335'. As shown in FIG. 16, the lower portion 313' may be disposed adjacent to the outer portion 335' of the second heat radiation part 330'.

When the shape of the lower portion 313' corresponds to an outer surface shape of the outer portion 335' of the second heat radiation part 330', and when the lower portion 313' is disposed adjacent to the outer surface the outer portion 335', a distance (a heat radiation path) from the lower portion 313' to the outer surface of the outer portion 335' becomes shorter. As a result, the heat radiation performance of the heat sink 300' can be more improved.

A thickness of the lower portion 313' may be from 1.0 T (mm) to 2.0 T. When the thickness of the lower portion 313' is from 1.0 T to 2.0 T, the lower portion 313' has an advantage of being the most easily molded. That is, when the thickness of the lower portion 313' is less than 1.0 T or larger than 2.0 T, the lower portion 313' is difficult to process and the shape of the lower portion 313' is difficult to maintain as it is.

A thickness of the outer portion 335' may be from 0.5 T to 2.0 T. When the thickness of the outer portion 335' is less than 0.5 T, a heat radiation path between the outside and the lower portion 313' of the first heat radiation part 310' becomes shorter, so that a withstand voltage characteristic is degraded and a flammability grade is difficult to comply with. When the thickness of the outer portion 335' is greater than 2.0 T, the heat radiation performance of the heat sink 300' is degraded.

A ratio of the thickness of the lower portion 313' of the first heat radiation part 310' to the thickness of the outer portion 335' of the second heat radiation part 330' may be from 1:1 to 2:1. When the thickness of the lower portion 313' of the first heat radiation part 310' is less than the thickness of the outer portion 335' of the second heat radiation part 330', the heat radiation performance of the heat sink 300' is degraded. When the thickness of the lower portion 313' of the first heat radiation part 310' exceeds two times the thickness of the outer portion 335' of the second heat radiation part 330', the withstand voltage characteristic is degraded.

Though not shown in the drawings, the outer portion 335' of the second heat radiation part 330' may have the fin 335*a* shown in FIGS. 1 to 5.

The substrate 210 of the light source module 200, the first heat radiation part 310' and the second heat radiation part 330' may be coupled to each other by using a coupling means like a screw. Specifically, the coupling means is coupled to the third hole H3 of the substrate 210, the fourth hole H4 of the first heat radiation part 310', and the sixth hole H6 of the second heat radiation part 330', so that the substrate 210 of the light source module 200, the first heat radiation part 310' and the second heat radiation part 330' may firmly coupled to each other.

The first heat radiation part 310' and the second heat radiation part 330' are integrally formed with each other. The mutually coupled first and second heat radiation parts 310' and 330' may be limited to separate from each other. Specifically, the first heat radiation part 310' and the second heat radiation part 330' are in a state of being stuck together by a predetermined process. Therefore, the first heat radiation part 310' and the second heat radiation part 330' are difficult to separate. Here, it is noted that the first heat radiation part 310' and the second heat radiation part 330' have been separated in FIGS. 2 to 3 for the sake of convenience of the description.

When the first heat radiation part 310' and the second heat radiation part 330' are integrally formed with each other or limited to separate from each other, a contact resistance between the metallic first heat radiation part 310' and the resin made-second heat radiation part 330' may be less than a contact resistance in a case where the first heat radiation part 310' and the second heat radiation part 330' are not integrally formed with each other. Thanks to the reduced contact resistance, it is possible to obtain a heat radiation performance same as or similar to that of the conventional heat sink (entirely formed of a metallic material). Further, when the first and second heat radiation parts 310' and 330' are integrally formed, the breakage and damage of the second heat radiation part 330' caused by external impact can be more reduced than when the first heat radiation part 310' and the second heat radiation part 330' are not integrally formed with each other.

An insert injection process may be used to integrally form the first heat radiation part 310' and the second heat radiation part 330'.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
   a heat sink;
   a light source module which is disposed on the heat sink, includes a substrate having at least one hole, and includes a plurality of light emitting devices disposed on a top surface of the substrate;
   a power supply unit which is disposed within the heat sink and includes a support plate and a plurality of parts disposed on the support plate; and
   a soldering portion which connects the substrate and the support plate,
   wherein the support plate includes an extended substrate which is disposed in the hole of the substrate,
   wherein the extended substrate includes a through-portion which has passed through the hole of the substrate, wherein the soldering portion electrically connects the through-portion of the extended substrate and the top surface of the substrate,
wherein a length of the through-portion of the extended substrate is from 1.5 mm to 2.0 mm,
wherein the heat sink includes a receiver receiving the power supply unit, and a pair of a first guide and a second guide which are disposed within the receiver and guide sides of one edge of the support plate, and
wherein a distance between the first guide and the second guide is reduced toward a lower portion of the heat sink.

2. The lighting device of claim 1, wherein the through-portion of the extended substrate and the top surface of the substrate comprise a terminal respectively, and wherein the soldering portion is disposed between the terminal of the substrate and the terminal of the through-portion of the extended substrate.

3. The lighting device of claim 1, wherein, in the hole of the substrate, a distance between the substrate and the extended substrate is greater than 0 or less than 0.2 mm.

4. The lighting device of claim 1, wherein the heat sink comprises a first heat radiation part on which the light source module is disposed, and a second heat radiation part within which the power supply unit is disposed,
wherein the second heat radiation part of the heat sink comprises an inner portion receiving the power supply unit, an outer portion enclosing the inner portion, and a first receiver disposed between the inner portion and the outer portion, and
wherein the first heat radiation part of the heat sink comprises an upper portion on which the substrate of the light source module is disposed, and a lower portion disposed in the first receiver of the second heat radiation part.

5. The lighting device of claim 4, wherein the first heat radiation part has a first thermal conductivity, wherein the second heat radiation part has a second thermal conductivity less than the first thermal conductivity, and wherein the first heat radiation part and the second heat radiation part are integrally formed with each other.

6. The lighting device of claim 4, wherein the upper portion of the first heat radiation part is disposed on the outer portion of the second heat radiation part, wherein a plurality of the upper portions of the first heat radiation part are provided, and wherein the plurality of the upper portions are disposed radially around the inner portion of the second heat radiation part.

7. The lighting device of claim 4, wherein the upper portion of the first heat radiation part is disposed on the inner portion of the second heat radiation part,
wherein a plurality of lower portions of the second heat radiation part are provided, and
wherein shapes of the plurality of the lower portions correspond to an outer surface shape of the outer portion of the second heat radiation part, and are disposed adjacent to the outer surface of the outer portion of the second heat radiation part.

8. The lighting device of claim 1, further comprising a base which supplies external power to the power supply unit,
wherein the heat sink includes a receiver receiving the power supply unit and includes a connection portion which is coupled to the base,
wherein the support plate of the power supply unit includes a protrusion, and
wherein the connection portion of the heat sink has a connection recess into which the protrusion of the support plate is inserted.

9. The lighting device of claim 8, wherein the protrusion is disposed in both corners of the lower portion of the support plate.

10. The lighting device of claim 8, wherein the protrusion has a hook shape.

11. The lighting device of claim 8, wherein the heat sink comprises a first heat radiation part on which the light source module is disposed, and a second heat radiation part having the receiver,
wherein the second heat radiation part of the heat sink comprises an inner portion having the receiver, and an outer portion enclosing the inner portion, and
wherein the first heat radiation part of the heat sink comprises an upper portion on which the substrate of the light source module is disposed, and a lower portion disposed between the inner portion of the second heat radiation part and the outer portion of the second heat radiation part.

12. The lighting device of claim 11, wherein the first heat radiation part has a first thermal conductivity, wherein the second heat radiation part has a second thermal conductivity less than the first thermal conductivity, and wherein the first heat radiation part and the second heat radiation part are integrally formed with each other.

13. The lighting device of claim 1, wherein, in an entrance of the receiver of the heat sink, the interval between the first guide and the second guide is greater than a value obtained by adding 1 mm to a thickness of the support plate.

14. The lighting device of claim 1, wherein, in a bottom surface of the receiver of the heat sink, the interval between the first guide and the second guide is greater than a thickness of the support plate and less than a value obtained by adding 0.1 mm to the thickness connection recess disposed between the first guide and the second guide, and wherein the support plate has a protrusion which is inserted into the connection recess.

15. The lighting device of claim 1, further comprising a base which supplies external power to the power supply unit, wherein the heat sink further comprises a connection portion which is coupled to the base, wherein the connection portion of the heat sink has a connection recess disposed between the first guide and the second guide, and wherein the support plate has a protrusion which is inserted into the connection recess.

16. The lighting device of claim 15, wherein the protrusion is disposed in both corners of the lower portion of the support plate.

17. The lighting device of claim 15, wherein the protrusion has a hook shape.

18. The lighting device of claim 1, wherein the heat sink comprises a first heat radiation part on which the light source module is disposed, and a second heat radiation part having the receiver,
wherein the second heat radiation part of the heat sink comprises an inner portion having the receiver, and an outer portion enclosing the inner portion, and
wherein the first heat radiation part of the heat sink comprises an upper portion on which the substrate of the light source module is disposed, and a lower portion disposed between the inner portion of the second heat radiation part and the outer portion of the second heat radiation part.

19. The lighting device of claim 1, wherein the extended substrate is coplanar with the support plate.

* * * * *